United States Patent
Tamura

(10) Patent No.: US 6,459,608 B2
(45) Date of Patent: Oct. 1, 2002

(54) FERROELECTRIC MEMORY AND METHOD OF READING OUT DATA THEREFROM

(75) Inventor: Tetsuro Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/818,579

(22) Filed: Mar. 28, 2001

(30) Foreign Application Priority Data

Apr. 11, 2000 (JP) ................................. 2000-109784

(51) Int. Cl.[7] ............................................. G11C 11/22
(52) U.S. Cl. ...................... 365/145; 365/149; 365/207
(58) Field of Search ............................. 365/145, 149, 365/207

(56) References Cited

U.S. PATENT DOCUMENTS

| | | | | |
|---|---|---|---|---|
| 5,297,077 A | * | 3/1994 | Imai et al. ................... | 365/145 |
| 5,615,145 A | * | 3/1997 | Takeuchi et al. ............. | 365/145 |
| 5,666,305 A | * | 9/1997 | Mihara et al. ............... | 365/145 |
| 5,677,825 A | * | 10/1997 | Evans, Jr. et al. ........ | 361/321.4 |
| 5,835,399 A | * | 11/1998 | Jeon ............................ | 365/145 |
| 5,889,696 A | * | 3/1999 | Kawakubo et al. ......... | 365/145 |
| 6,157,563 A | * | 12/2000 | Hirano et al. ............... | 365/145 |
| 6,185,123 B1 | * | 2/2001 | Allen et al. .................. | 365/145 |
| 6,198,654 B1 | * | 3/2001 | Ashikaga .................... | 365/145 |
| 6,330,178 B1 | * | 12/2001 | Sakata et al. ............... | 365/145 |

* cited by examiner

*Primary Examiner*—Richard Elms
*Assistant Examiner*—Tuan T. Nguyen
(74) *Attorney, Agent, or Firm*—Arent Fox Kintner Plotkin & Kahn

(57) ABSTRACT

Data stored in a ferroelectric capacitor having its one electrode connected to a plate line and its other electrode connected to a bit line is read out by inputting a pulse to the plate line and then performing a sense operation to amplify the data. The sense operation is performed after a signal from the non-switching ferroelectric capacitor is decreased from its peak value right after pulsing the plate line. A predetermined time is ensured from input of the pulse to the sense operation. With this arrangement, the signal output can be decreased. The signal output margin can be ensured, and the service life of a device can be increased by decreasing the output from the bit line due to the imprint effect on the capacitor.

10 Claims, 9 Drawing Sheets

FERROELECTRIC MEMORY AND METHOD OF READING OUT DATA THEREFROM

CROSS-REFERENCE TO RELATED APPLICATIONS

This application is based upon and claims priority of Japanese Patent Application No. 2000-109784, filed on Apr. 11, 2000, the contents being incorporated herein by reference.

BACKGROUND OF THE INVENTION

1. Field of the Invention

The present invention relates to data reading methods and semiconductor memory devices, particularly to ferroelectric memories using oxide ferroelectric thin films for capacitors.

2. Description of the Related Art

In recent semiconductor memory devices used is a ferroelectric memory called an FRAM in place of a volatile memory such as a DRAM. The ferroelectric memory is a memory using a ferroelectric thin film (PZT film, PLZT film, BTO film, or the like) for a storage element and has such excellent characteristic features that the times of rewrite can be greatly increased, the energy necessary for a rewrite can be reduced, and the rewrite speed can be considerably increased.

There is a ferroelectric memory having such a ferroelectric capacitor integrated on a semiconductor device.

The ferroelectric memory can be formed with almost the same structure as that of a DRAM except that a ferroelectric film is used as the capacitor film (dielectric film) of a memory cell and allows high degree of integration like a DRAM. In addition, since polarization inversion of a ferroelectric material is used, written data is nonvolatile, and can be rewritten at high speed and low power consumption.

The structure and operation of the ferroelectric memory will be described below with reference to drawings.

FIG. 1 shows the hysteresis characteristics of the ferroelectric capacitors C0 and C1. Referring to FIG. 1, the abscissa represents the potential of the electrode on the plate line PL side with respect to that of the electrode on the bit line BL0 or BL1 side, and the ordinate represents polarization. For the illustrative convenience, points +Pr and −Pr represent the states "0" and "1", respectively.

As a 2-transistor/2-capacitor memory cell, data "1" corresponds to a state wherein "0" is written in the ferroelectric capacitor C0, and "1" is written in the ferroelectric capacitor C1, and data "0" corresponds to a state wherein "0" is written in the ferroelectric capacitor C1, and "1" is written in the ferroelectric capacitor C0.

FIG. 2 is a timing chart showing circuit operation in reading data "1". This circuit operation in reading data "1" will be described below with reference to FIG. 2.

First, the potential of the word line connected to the selected cell is raised to turn on the switching transistors. Next, a pulse is input to the plate line PL. Charges move onto the bit line BL1 due to polarization inversion of the ferroelectric capacitor C1, so the potential of the bit line BL1 rises.

On the other hand, the potential of the bit line BL0 does not change because no polarization inversion occurs in the ferroelectric capacitor C0. When the sense amplifier 1 is activated (high state) time $t_0'$ after from the pulse input, the potential difference between the bit lines BL0 and BL1 is amplified, and data is externally read out. At this time, the data is written in the ferroelectric capacitor C1 again due to the potential difference between the plate line PL and the bit line BL1. Next, a pulse is input to the plate line PL again, thereby writing opposite data in the ferroelectric capacitor C0.

However, when data are written in the ferroelectric capacitors C0 and C1 and held for a long time, a voltage shift occurs in hysteresis characteristics. This phenomenon is called an imprint effect. When imprinting occurs, polarization in one direction becomes stable. However, when opposite data is written, depolarization occurs to make the data write/read difficult.

FIGS. 3A and 3B, and 4A and 4B show changes in polarization in reading data from an imprinted ferroelectric capacitor. Symbol $\Delta P01$ and the like in FIGS. 3A to 4B represents a polarization change amount, in which the first numeral indicates the direction of imprinting, and the second numeral indicates data to be read. For example, $\Delta P01$ means that "1" is written/read in/from a capacitor imprinted in the "0" direction. A write/read of data in the same direction as the imprinting direction is represented by SS (Same State), and a write/read of data in the direction opposite to the imprinting direction is represented by OS (Opposite State). Hence, $\Delta P01$ and $\Delta P10$ correspond to OS (Opposite State), and $\Delta P00$ and $\Delta P11$ correspond to SS (Same State).

Referring to FIGS. 3A and 3B, in the OS (Opposite State), when imprinting progresses, the value $\Delta P01$ decreases. On the other hand, as shown in FIGS. 4A and 4B, in the SS (Same State), the value of polarization change rarely changes. For this reason, when the potential difference between the bit lines BL0 and BL1 is to be detected in the OS (Opposite State), the difference between the value $\Delta P01$ and the value $\Delta P10$ is detected as a smaller value than in an un-imprinted state because the value $\Delta P01$ decreases and the value $\Delta P10$ increases. As imprinting progresses, the difference between the value $\Delta P01$ and the value $\Delta P10$ decreases.

FIGS. 5A and 5B show a change over time in each polarization. FIG. 5A shows a signal margin in the SS (Same State). FIG. 5B shows a change in signal margin in the OS (Opposite State). As shown in FIG. 5A, in the SS (Same State), since the polarization change amount does not vary due to imprinting, the signal margin does not change. However, in the OS (Opposite State), the signal margin changes over time as imprinting progresses. When this margin becomes lower than the read capability of the circuit, the data read is disabled. This determines the service life of a device.

Such an imprint effect is an inherent phenomenon caused by the hysteresis characteristics of a ferroelectric film and therefore cannot be completely suppressed. This imprinting makes it impossible to read desired data and also limits the service life of a device.

As described above, an FRAM has excellent characteristics that nonvolatile data can be written, and can be rewritten at high speed and low power consumption. However, when a shift due to the imprint effect occurs in the hysteresis characteristics of the capacitor, a data read error occurs, and the service life is shortened.

SUMMARY OF THE INVENTION

It is an object of the present invention to provide a data reading method and a semiconductor memory device, which allow a data read with a minimum read error by ensuring an output margin necessary for the read and improve the service life of a device even when imprinting occurs in a ferroelectric memory using a ferroelectric film and the polarization change amount varies.

According to the present invention, there is provided a data reading method of reading data stored in a ferroelectric capacitor having one electrode connected to a plate line and the other electrode connected to a bit line through a selecting transistor, by inputting a pulse to the plate line and then performing sense operation to amplify the data. The sense operation is performed after a signal is output from the bit line on the basis of the pulse, and the signal output is decreased from a peak value.

According to another aspect of the data reading method of the present invention, the signal output is decreased by ensuring a predetermined time from input of the pulse to the sense operation.

According to the present invention, there is also provided a semiconductor memory device for reading stored data by the above-described data reading method, wherein a data read or write is performed while an imprint effect of the ferroelectric capacitor is reduced in a refresh or every predetermined time or every predetermined number of times of read.

The present invention comprises the above technical means. Even when imprinting occurs in the hysteresis of a ferroelectric film formed in the ferroelectric memory, and the signal output from the non-switching capacitor (data "0") becomes larger than a normal value, unfavorable increase of bit line level can be canceled because the sense operation is performed after the signal output is decreased from the peak value. Hence, even when imprinting occurs in a data write or read, the signal output margin can be ensured.

According to the present invention, even when the characteristics of the ferroelectric capacitor change due to imprinting, data can be accurately read. Hence, high reliability and long service life of a device can be realized.

DETAILED DESCRIPTION OF THE PREFERRED EMBODIMENTS

Embodiments of the present invention will be described below with reference to drawings.

First Embodiment

Figure 6:
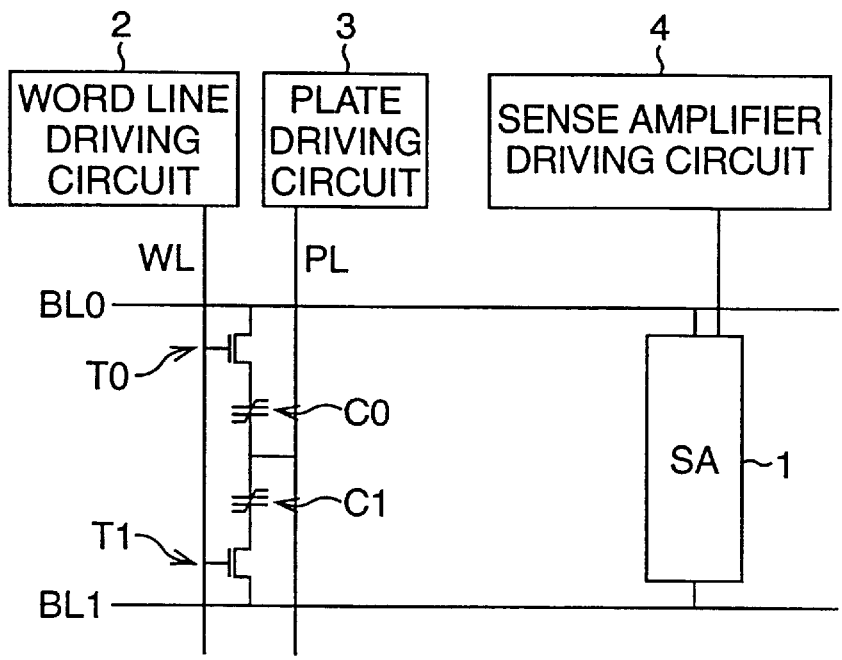
FIG. 6 is a diagram showing the construction of a semiconductor memory device formed from a ferroelectric memory.

The first embodiment of the present invention will be described first. FIG. 6 shows the construction of a semiconductor memory device formed from a ferroelectric memory. A circuit having a 2-transistor/2-capacitor (2T2C) structure as the basic structure of a cell is shown here.

Referring to FIG. 6, one electrode of each of ferroelectric capacitors C0 and C1 each formed from a ferroelectric film is connected to the corresponding one of bit lines BL0 and BL1 through the corresponding one of switching transistors (selection transistors) T0 and T1. The other electrode of each of the ferroelectric capacitors C0 and C1 is connected to a plate line PL. The switching transistors T0 and T1 are driven by a word line WL. The bit lines BL0 and BL1 are connected to a sense amplifier (SA) 1. In a data read, the potential difference between the bit lines BL0 and BL1 is amplified by the sense amplifier (SA) 1. The word line WL is connected to a word line driving circuit 2. The plate line PL is connected to a plate driving circuit 3. The sense amplifier (SA) 1 is connected to a sense amplifier driving circuit 4. The data reading method of this embodiment will be described below with reference to drawings.

Figure 7:
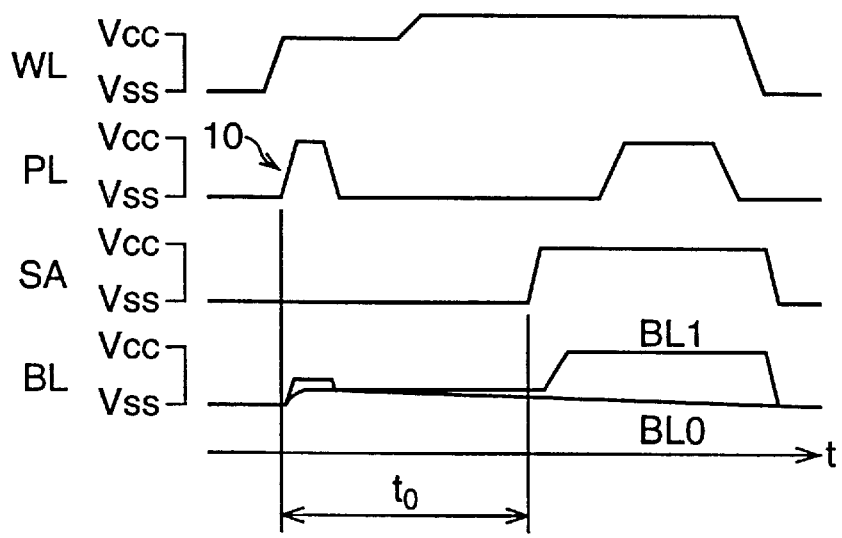
FIG. 7 is a timing chart showing circuit operation in a data reading method according to the first embodiment of the present invention.

FIG. 7 is a timing chart showing circuit operation in reading data "1". The circuit operation in reading data "1", i.e., when "0" is written in a ferroelectric capacitor C0, and "1" is written in a ferroelectric capacitor C1 will be described.

First, the potential of a word line WL connected to the selected cell is raised to turn switching transistors T0 and T1 on. Next, a pulse 10 is input to a plate line PL. Polarization inversion occurs in the ferroelectric capacitor C1 having "1" written therein to move charges onto a bit line BL1, so the potential of the bit line BL1 rises.

On the other hand, the potential of a bit line BL0 should not change because no polarization inversion occurs in the ferroelectric capacitor C0 having "0" written therein. When a sense amplifier 1 is activated (high state), the potential difference between the bit lines BL0 and BL1 is amplified, and data is externally read out. At this time, the data is written in the ferroelectric capacitor C1 again due to the potential difference between the plate line PL and the bit line BL1. Next, a pulse is input to the plate line PL again, thereby writing opposite data in the ferroelectric capacitor C0.

Figure 1:
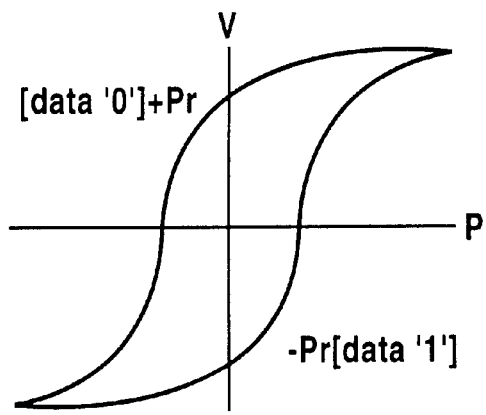
FIG. 1 is a graph showing the hysteresis characteristics of a ferroelectric capacitor.
Figure 2:
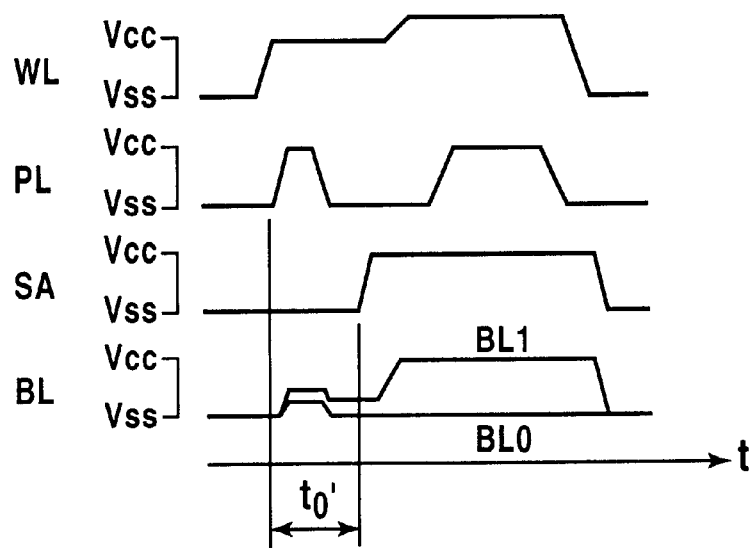
FIG. 2 is a timing chart showing circuit operation in a conventional data reading method.
Figure 3A:
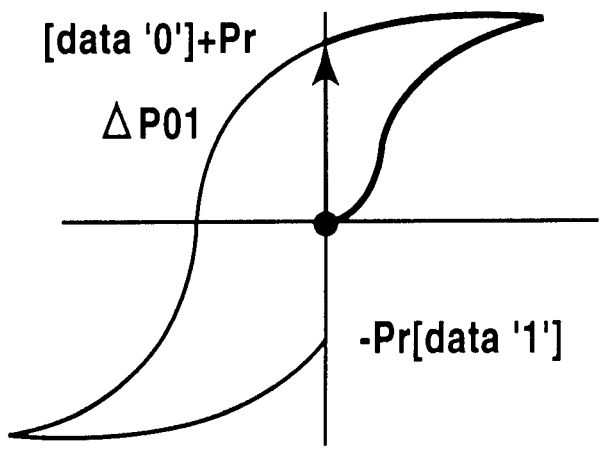
FIGS. 3A and 3B are graphs showing changes in polarization in an OS (Opposite State)
Figure 3B:
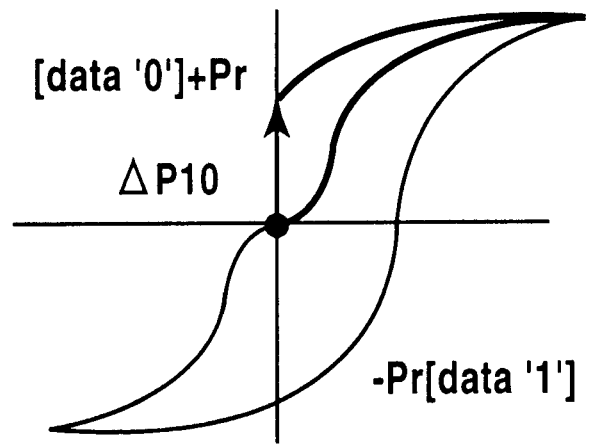
Figure 4A:
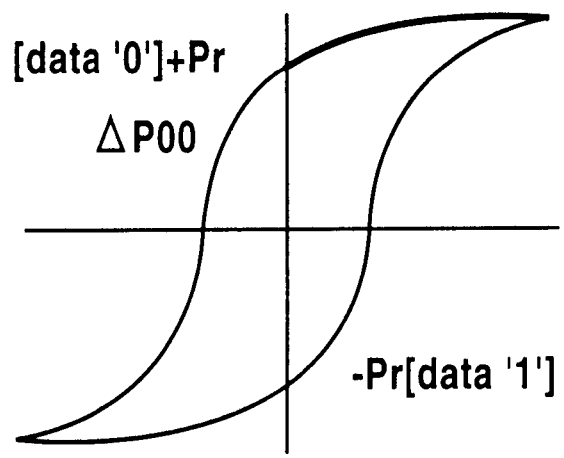
FIGS. 4A and 4B are graphs showing changes in polarization in an SS (Same State)
Figure 4B:
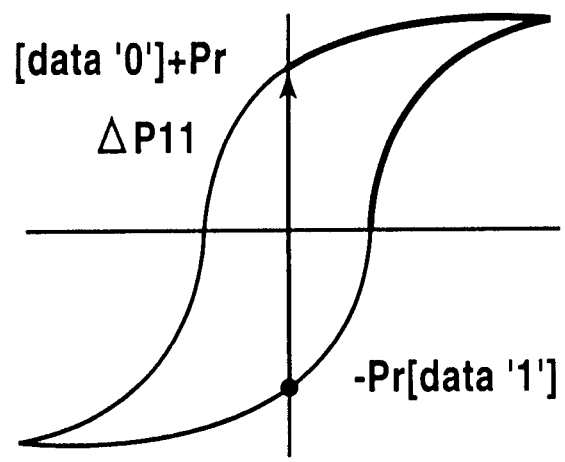
Figure 5A:
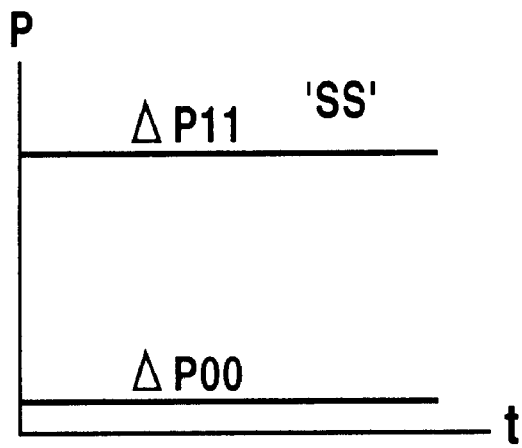
FIGS. 5A and 5B are graphs showing signal margins in the SS (Same State) and OS (Opposite State) in the prior art.
Figure 5B:
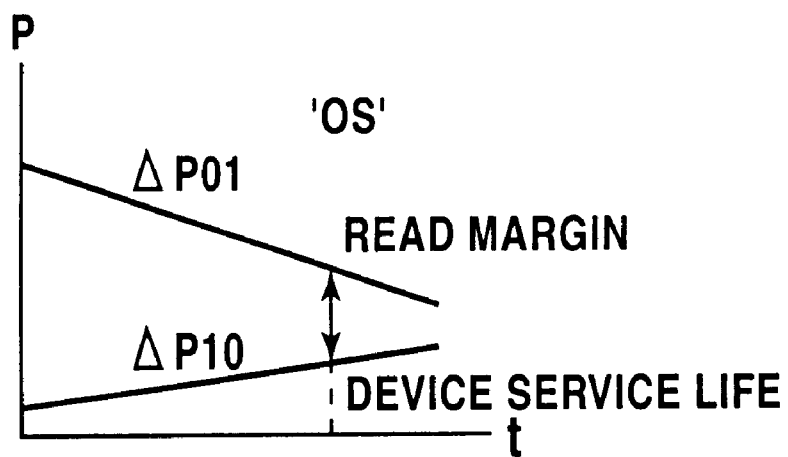

In the timing chart shown in FIG. 7, the start timing of sense operation is set such that a time $t_0$ until the start of sense operation becomes longer than the time $t_0'$ in the timing chart of FIG. 2. The sense operation starts after the potential of the bit lines BL0 and BL1 rises in accordance with the input of the pulse 10, and then, the potential of the bit line BL0 lowers after the elapse of a predetermined time. The sense operation preferably starts after the decrease amount of the potential of the bit line BL0 becomes 100 mV (to sense amplifier detection limit) or more.

Figures 8A, 8B:
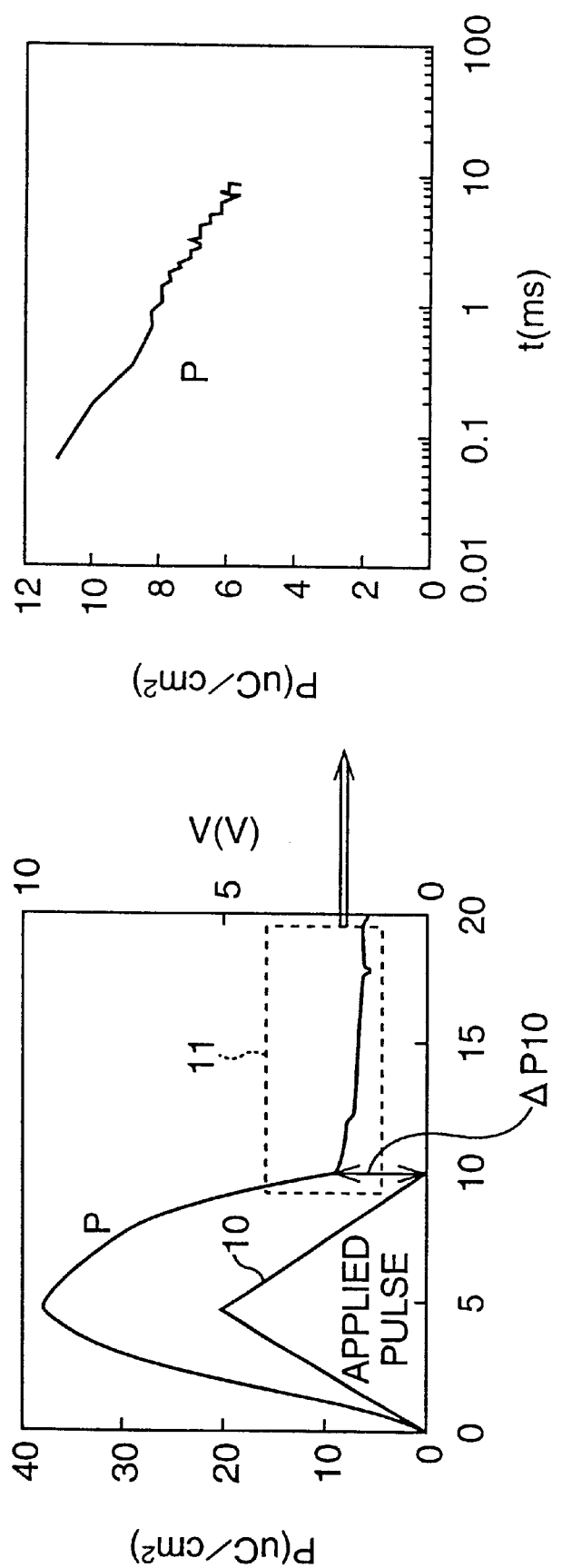
FIGS. 8A and 8B are graphs showing changes in polarization in reading data from a ferroelectric capacitor in the OS (Opposite State) in the first embodiment of the present invention.

FIGS. 8A and 8B are graphs showing outputs when imprinting occurs in an OS (Opposite State), and data is read from a cell having data "1" while delaying the sense operation by a predetermined time. FIG. 8A is a graph showing a change in polarization with respect to time when data "0" is read by applying the pulse 10 to the ferroelectric capacitor C0 imprinted to "1", and a change in polarization after a predetermined time has elapsed from application of the pulse 10.

Immediately after the pulse 10 is applied to the plate line PL, the potential of the bit line BL0 should not change. However, as shown in FIG. 8A, when the ferroelectric capacitor C0 is imprinted to "1", a polarization change amount corresponding to the depolarization amount is detected as a value $\Delta P10$. After that, as time elapses, the depolarization occurs again to lower the potential of the bit line BL0. In this embodiment, the output $\Delta P10$ from the bit line BL0 is detected after the depolarization occurs.

Figure 9A:
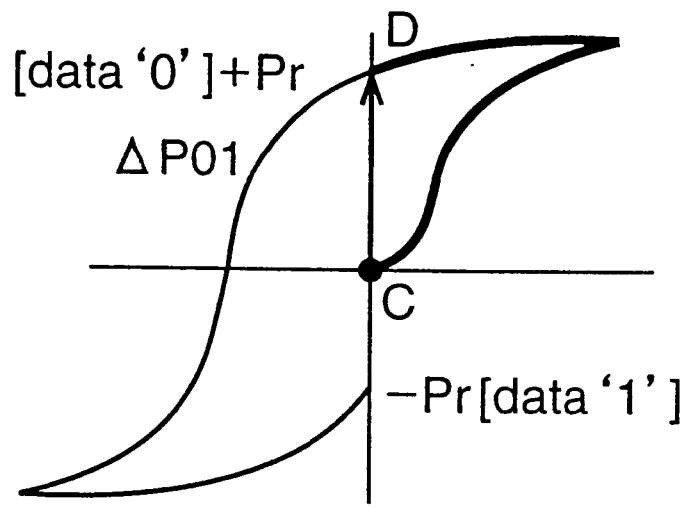
FIGS. 9A and 9B are graphs showing changes in polarization in reading data from a ferroelectric capacitor in the OS (Opposite State) in the first embodiment of the present invention.
Figure 9B:
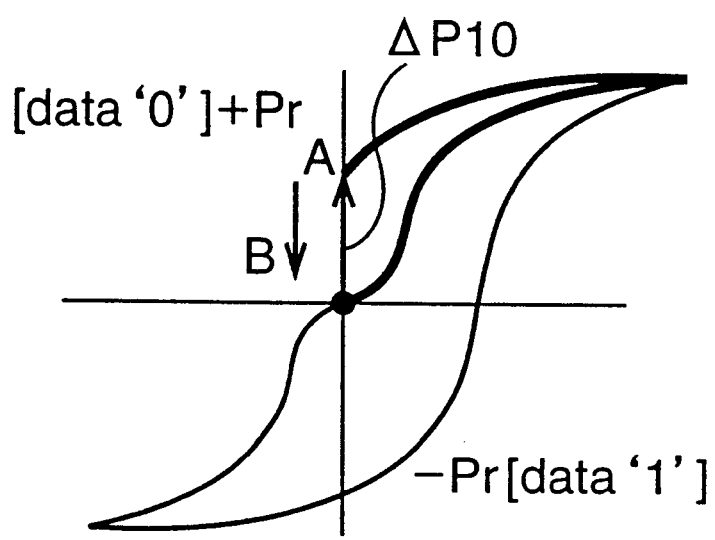

Depolarization that occurs after application of the pulse 10 will be described with reference to FIGS. 9A and 9B. As shown in FIG. 9B, in the ferroelectric capacitor C0 imprinted to "1", immediately after application of the pulse 10, a polarization change amount equal to the value $\Delta P10$ is detected. However, since the hysteresis of the ferroelectric capacitor C0 is imprinted to the "1" side, a terminal point A of $\Delta P10$ moves in a direction indicated by an arrow B (imprinting direction) as time elapses. This causes depolarization, and the value $\Delta P10$ decreases along with the elapse of time.

As shown in FIG. 8A, after a time of about 10 ms has elapsed from application of the pulse 10, the value $\Delta P10$ decreases to a value about ½ that immediately after application of the pulse 10. Hence, when a predetermined or more time is ensured from application of the pulse 10 to the plate line PL to the sense operation, the output from the bit line BL0, which should not be output, can be canceled. With this arrangement, even when the ferroelectric capacitor C0 is imprinted to the "1" side, the same output as in an unimprinted state can be obtained.

FIG. 8B shows an enlarged view of the region indicated by an alternate long and short dashed line 11 in FIG. 8A. Referring to FIG. 8B, a change in value $\Delta P10$ from a time of about 0.1 ms to 10 ms is plotted. When a change amount in $\Delta P10$ in a predetermined time after application of the pulse 10 is detected, the sense operation start timing $t_0$ shown in FIG. 7 can be set to a desired timing on the basis of the detection result.

For the other ferroelectric capacitor C1 of the 2-transistor/2-capacitor memory cell, data "1" is read from the capacitor imprinted to the "0" side ($\Delta P01$). In this case, the position of a start point C changes due to the depolarization. However, since the capacitor is imprinted to the "0" side, no depolarization after application of the pulse 10 occurs, so the position of a terminal point D does not change. Hence, the sense operation timing does not affect the value $\Delta P01$.

The signal margin in the 2-transistor/2-capacitor operation is determined by the difference between the values $\Delta P01$ and $\Delta P10$. Since the difference between the values $\Delta P01$ and $\Delta P10$ can be increased by canceling the influence of imprinting in the ferroelectric capacitor C0 to decrease the value $\Delta P10$, the signal margin can be increased.

Figure 10A:
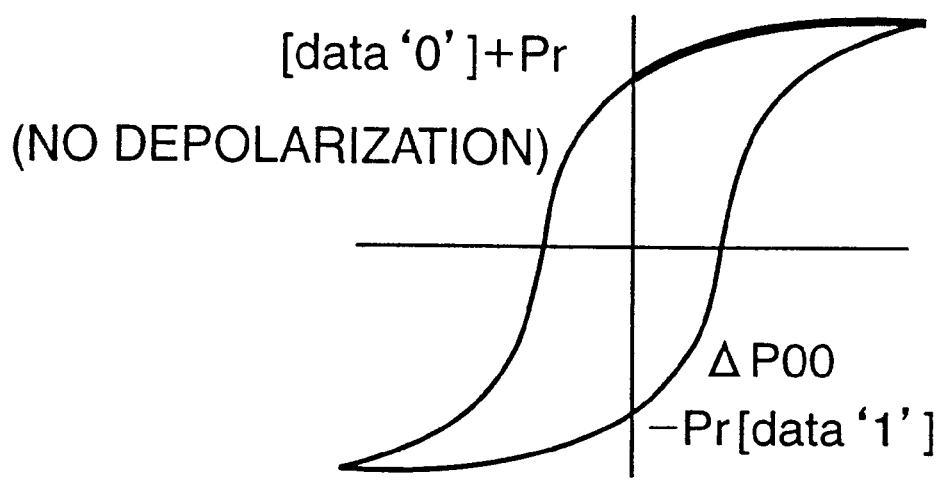
FIGS. 10A and 10B are graphs showing changes in polarization in reading data from a ferroelectric capacitor in the SS (Same State) in the first embodiment of the present invention.
Figure 10B:
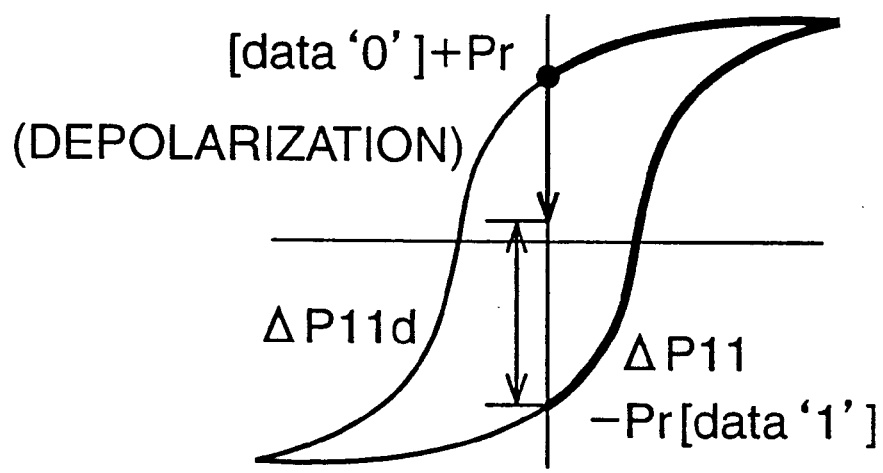

A data read in the SS (Same State) will be described next. FIGS. 10A and 10B show the depolarization state in the SS (Same State). As shown in FIG. 10B, in the ferroelectric capacitor C1 having data "1" written therein, since the capacitor is imprinted to the "1" side, depolarization occurs after pulse application, and a value $\Delta P11$ decreases to value $\Delta P11d$ after depolarization. On the other hand, as shown in FIG. 10A, in the ferroelectric capacitor C0 having data "0" written therein, since the capacitor is imprinted to the "0" side, a value $\Delta P00$ is not affected by depolarization.

Figure 11A:
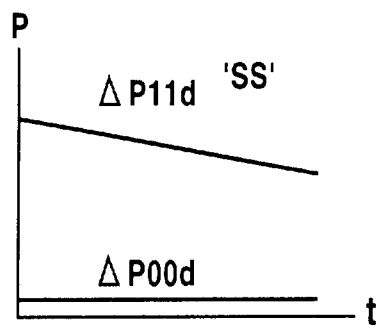
FIGS. 11A and 11B are graphs showing changes over time in signal margin in the SS (Same State) and OS (Opposite State) in the first embodiment.
Figure 11B:
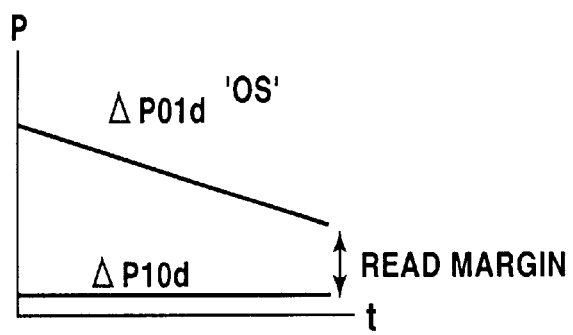

FIGS. 11A and 11B show changes over time in signal margin in the OS (Opposite State) and SS (Same State) in the first embodiment. As described above, in the OS (Opposite State), the value $\Delta P10$ is decreased by delaying the sense operation. Even when imprinting progresses, any increase in value $\Delta P10$ can be suppressed. Hence, any decrease in signal margin due to the difference between the values $\Delta P01$ and $\Delta P10$ can be suppressed. In the SS (Same State), although the value $\Delta P11$ is affected by the progress of imprinting, the life isn't shorter than in "OS" (Opposite State) case. Because the device life is determined by either SS (Same State) or OS (Opposite State) which has shorter life, and non OS (Opposite State) signal margin is improved, the service life of a device can be kept long.

As described above, according to the first embodiment of the present invention, even when the ferroelectric capacitor is imprinted, depolarization is made to occur in a data read in the OS (Opposite State) by ensuring a predetermined time between pulse application to the plate line PL and the start of sense operation by the sense amplifier 1, so the value $\Delta P10$ can be decreased. Hence, even when imprinting progresses, a large output margin can be ensured.

Second Embodiment

The second embodiment of the present invention will be described next with reference to FIG. 12. In the first embodiment, the sense operation is delayed to decrease the value $\Delta P10$, thereby ensuring the output margin. In the second embodiment, instead of delaying the sense operation, and then, an opposite voltage lower than the driving voltage is applied to the ferroelectric capacitor, thereby obtaining depolarization.

Figure 12:
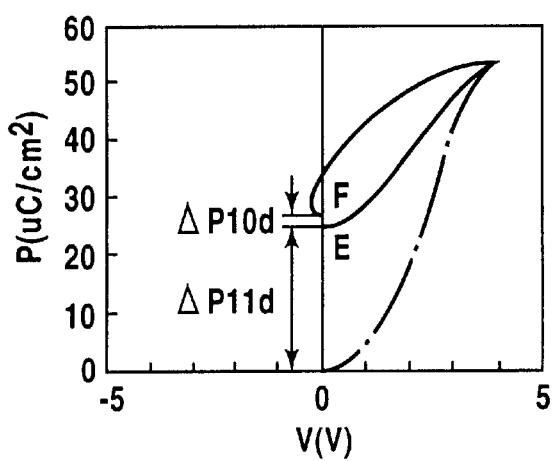
FIG. 12 is a graph showing a change in polarization when a pulse is applied to a plate line PL and then an opposite voltage of −0.5 V is applied.

FIG. 12 is a graph showing a change in polarization when an opposite voltage is applied. FIG. 12 shows a change in polarization when a pulse is applied to the plate line PL and then an opposite voltage of –0.5 V is applied to the ferroelectric capacitor. As the polarization shifts from a point E to a point F along the hysteresis loop indicated by the solid line, a polarization change amount is detected. In this way, when an opposite voltage is applied to the ferroelectric capacitor, a value $\Delta P10$ can be reduced to almost 0b.

As described above, according to the second embodiment of the present invention, even when the ferroelectric capacitor is imprinted, depolarization can be made to occur in a data read in the OS (Opposite State) to decrease the value $\Delta P10$ by applying a pulse to the plate line PL and then applying a negative voltage to the ferroelectric capacitor. Hence, even when imprinting progresses, a large output margin can be ensured.

Third Embodiment

The third embodiment of the present invention will be described next. In the second embodiment, a negative voltage is applied to the plate line PL to lower the potential, thereby causing depolarization. In the third embodiment, conversely, an opposite voltage is applied by raising the potential of a bit line BL, thereby making depolarization occur.

To increase the potential of the bit line BL, before read operation, the bit line is precharged not to a ground potential (Vss) but to a voltage higher than the ground potential (Vss) by a desired opposite voltage level, and then the read is performed.

With this operation, the opposite voltage remains in the capacitor after a pulse is applied to a plate line PL, so a value ΔP10 can be decreased by depolarization, as in the second embodiment. To set the precharge potential, a predetermined number of bit lines (e.g., about 10 bit lines) out of bit lines are set to a power supply potential (Vcc), the remaining bit lines are precharged to the ground potential (Vss), and then, they are short-circuited.

As described above, according to the third embodiment of the present invention, even when the ferroelectric capacitor is imprinted, depolarization can be made to occur in a data read in the OS (Opposite State) to decrease the value ΔP10, as in the second embodiment, by applying a pulse to the plate line PL and then raising the potential of the bit line BL. Hence, even when imprinting progresses, a large output margin can be ensured.

Fourth Embodiment

The fourth embodiment of the present invention will be described next. Even in a hysteresis loop having a voltage shift due to imprinting, the shift amount can be decreased by repeating polarization inversion several times. In the fourth embodiment, using such a characteristic of a hysteresis loop, a read/write is performed every predetermined time to refresh the hysteresis characteristics. In the refresh (power on), this operation can be done by reading data by the reading method described in the first to third embodiments every predetermined time or every predetermined number of times of read. When the shift amount is decreased, the reliability of the device can be increased. In addition, a parity bit may be prepared, e.g., every eight bits to determine whether the data is correct, and when an error is detected, the data read may be re-executed by the reading method described in the first to third embodiments.

What is claimed is:

1. A data reading method for reading out data stored in a ferroelectric capacitor having its one electrode connected to a plate line and its other electrode connected to a bit line through a selecting transistor, said method comprising the steps of:

inputting a pulse onto said plate line;

outputting a signal through said bit line on the basis of said pulse; and, after said signal being output from a non-switching ferroelectric capacitor has decreased from its peak value right after pulsing said plate line, performing a sense operation to amplify said data being read out.

2. The method according to claim 1, wherein said signal being output is decreased by setting a predetermined time after said pulse is input till said sense operation is started.

3. The method according to claim 1, wherein said signal being output is decreased by applying a voltage to said ferroelectric capacitor in the reverse direction to said pulse after said pulse is input.

4. The method according to claim 3, wherein said voltage in the reverse direction is applied by pre-charging said bit line to a potential higher than a ground potential.

5. The method according to claim 4, further comprising a plurality of bit lines, wherein pre-charging is performed by the manner that the predetermined number of bit lines are set at an operational potential and all the remaining bit lines are set at said ground potential and then said bit lines at said operational potential is short-circuited with said remaining bit lines.

6. The method according to claim 1, wherein said sense operation is performed after said signal being output has decreased from said peak value by 100 mV or more.

7. A semiconductor memory device comprising a ferroelectric capacitor with its one electrode connected to a plate line and its other electrode connected to a bit line, data stored in said ferroelectric capacitor being read out by inputting a pulse onto said plate line and then performing a sense operation to amplify said data, wherein said sense operation is performed after a signal being output through said bit line on the basis of said pulse has decreased from its peak value.

8. The device according to claim 7, wherein said signal being output is decreased by setting a predetermined time after said pulse is input till said sense operation is started.

9. The device according to claim 7, wherein said signal being output is decreased by applying a voltage to said ferroelectric capacitor in the reverse direction to said pulse.

10. The device according to claim 7, wherein data read or write operations are so performed as to reduce the imprint effect of said ferroelectric capacitor upon a refresh operation, at every predetermined time, or in every predetermined number of read operations.

* * * * *